United States Patent [19]

Vu et al.

[11] Patent Number: 5,717,360

[45] Date of Patent: Feb. 10, 1998

[54] HIGH SPEED VARIABLE GAIN AMPLIFIER

[75] Inventors: Ha Vu; Kevin Elmer Brehmer, both of San Jose, Calif.

[73] Assignee: National Semiconductor Corporation, Santa Clara, Calif.

[21] Appl. No.: 633,070

[22] Filed: Apr. 16, 1996

[51] Int. Cl.⁶ .................................. H03F 3/45; H03F 3/16
[52] U.S. Cl. .................................. 330/253; 330/300
[58] Field of Search .................................. 330/253, 261, 330/277, 285, 300

[56] References Cited

U.S. PATENT DOCUMENTS

| | | | |
|---|---|---|---|
| 3,689,752 | 9/1972 | Gilbert | 235/194 |
| 3,931,583 | 1/1976 | Gilbert | 330/38 |
| 4,075,574 | 2/1978 | Gilbert | 330/257 |
| 4,156,283 | 5/1979 | Gilbert | 364/841 |
| 4,268,759 | 5/1981 | Gilbert | 307/490 |
| 4,360,786 | 11/1982 | Rehfeldt | 330/254 |
| 4,604,532 | 8/1986 | Gilbert | 307/490 |
| 4,812,781 | 3/1989 | Regnier | 330/254 |
| 4,888,560 | 12/1989 | Ogura | 330/254 |
| 4,963,836 | 10/1990 | Noguchi et al. | 330/254 |
| 5,113,149 | 5/1992 | Terada et al. | 330/254 |
| 5,157,559 | 10/1992 | Gleason et al. | 360/46 |
| 5,373,248 | 12/1994 | Fernandez | 330/253 |
| 5,418,494 | 5/1995 | Betti et al. | 330/254 |
| 5,451,902 | 9/1995 | Huang et al. | 330/253 |

OTHER PUBLICATIONS

Barrie Gilbert, "A New Wide-Band Amplifier Technique", IEEE Journal of Solid-State Circuits, vol. SC-3, No. 4, Dec. 1968, pp. 353–365.

Barrie Gilbert, "A High-Performance Monolithic Multiplier Using Active Feedback", IEEE Journal of Solid-State Circuits, vol. SC-9, No. 6, Dec. 1974, pp. 364–373.

Barrie Gilbert, "A New Technique for Analog Multiplication", IEEE Journal of Solid-State Circuits, vol. SC-10, No. 6, Dec. 1975, pp. 437–447.

Barrie Gilbert, "Single-Ended-Input Single-Ended-Output Four-Quadrant Analog Multiplier", IEEE Journal of Solid-State Circuits, Oct. 1972, vol. SC-7, No. 5, p. 434.

National Semiconductor Corporation, "LM363 Precision Instrumentation Amplifier" Linear Databook 1, 1988 Edition, pp. 5–46 thru 5–564.

Davy Choi et al., "An Analog Front-End Signal Processor for a 64 Mbits/s PRML Hard-Disk Drive Channel", IEEE Journal of Solid-State Circuits, vol. 29, No. 12, Dec. 1994, pp. 1596–1603.

Beomsup Kim et al., "An Integrated CMOS Mixed-Mode Signal Processor for Disk Drive Read Channel Applications", IEEE Transactions on Circuits and Systems–II: Analog and Digital Signal Processing, vol. 41, No. 1, Jan. 1994, pp. 1–11.

Stephen H. Lewis, H. Scott Fetterman, George F. Gross Jr., R. Ramachandran and T.R. Viswanathan, "A 10-b 20-Msample/s Analog-to-Digital Converter", IEEE Journal of Solid-State Circuits, vol. 27, No. 3, Mar. 1992, pp. 351–358.

*Primary Examiner*—Steven Mottola
*Attorney, Agent, or Firm*—Limbach & Limbach L.L.P.

[57] ABSTRACT

A MOSFET amplifier includes an amplifier stage with a boosted transconductance and a differential current mirror. The amplifier stage with a boosted transconductance includes complementary MOSFETs cross-connected with a fixed current source whereby the drain-to-source current and, therefore, the gate-to-source voltage, of the input MOSFET is fixed by the current source, while the drain-to-source current of the other MOSFET is dependent upon the input signal voltage. The differential current mirror includes a multiple branch differential input stage with a bridging resistor connected between the differential branches. The bridging resistor conducts a bridging current which equals one half of the difference between the differential branch currents, is substantially zero when the differential input voltage is zero and is nonzero when the differential input voltage is nonzero. Variable voltage gain is provided by a serial arrangement of voltage-to-current and current-to-voltage converters with a controllable current gain.

36 Claims, 11 Drawing Sheets

HIGH SPEED VARIABLE GAIN AMPLIFIER

RELATED APPLICATIONS

This is a Continuation-In-Part of U.S. patent application Ser. No. 60/006,117, filed Oct. 23, 1995, and entitled "High Speed Variable Gain Amplifier."

BACKGROUND OF THE INVENTION

1. Field of the Invention

The present invention relates to analog amplifiers, and in particular, to analog amplifiers in which complementary metal oxide semiconductor field effect transistors (CMOSFETs) and bipolar junction transistors (BJTs) are used together so as to take advantage of the high input impedances available with MOSFETs and current multiplication capabilities of BJTs.

2. Description of the Related Art

Fast settling, variable (e.g. switchable) gain amplifiers present many design challenges. For example, such an amplifier must often have a high input impedance, a tunable gain control, the ability to switch gain and settle fast, and the ability to recover quickly when overdriven by a large input signal.

One such type of amplifier is often referred to as a Gilbert multiplier, or Gilbert cell. Gilbert multipliers work well for applications that use large power supply voltages and provide a tunable gain control. However, such amplifiers rely upon BJTs and thus have bipolar inputs for which the input impedances are relatively low, and their gain switching capabilities are quite limited.

SUMMARY OF THE INVENTION

A high speed variable gain amplifier in accordance with the present invention uses an open loop architecture for settling time verses gain requirements, and includes a bias generator circuit, a gain control circuit and a core amplifier circuit. Such an amplifier can be implemented in any BiCMOS technology, e.g. an N-Well CMOS and NPN based process, and includes a transconductance ("GM") boost circuit for improving the linearity of its voltage-to-current ("V-I") converter and providing an output current, and a current amplifier stage with a switchable folded Gilbert cell and a translated input current to output voltage suitable for applications requiring low power supply voltages. Gain control is accomplished using an external voltage and a current switching MOSFET. Input signal overdrive is controlled by current starving, thereby providing for fast recovery. High input impedance is provided for facilitating applications requiring AC coupling.

In accordance with one embodiment of the present invention, a metal oxide semiconductor field effect transistor (MOSFET) amplifier with a boosted transconductance includes two transistors and a current source. The first transistor has gate, drain and source terminals and is for receiving an input voltage via its gate terminal, conducting a first drain-to-source current via its drain and source terminals, and having a first gate-to-source voltage across its gate and source terminals. The second transistor has gate, drain and source terminals and is for conducting a second drain-to-source current via its drain and source terminals. The second transistor gate terminal is connected to the first transistor drain terminal and the second transistor drain terminal is connected to the first transistor source terminal. The current source is connected between the second transistor gate and source terminals and is for providing a fixed current as the first transistor drain-to-source current. The first transistor gate-to-source voltage remains fixed in accordance with the fixed first transistor drain-to-source current and the second transistor drain-to-source current is generated in accordance with the input voltage.

In accordance with another embodiment of the present invention, a differential current mirror circuit includes first and second circuit nodes, first and second input circuit branches, first and second auxiliary circuit branches, a bridging resistance, and first and second output circuit branches. The first input circuit branch is connected to the first circuit node and is for receiving and conducting a first input branch current from the first circuit node and receiving a first input voltage and in accordance therewith providing a first output voltage. The first auxiliary circuit branch is connected to the first circuit node and is for receiving the first output voltage and in accordance therewith receiving and conducting a first auxiliary branch current from the first circuit node. The second input circuit branch is connected to the second circuit node and is for receiving and conducting a second input branch current from the second circuit node and receiving a second input voltage and in accordance therewith providing a second output voltage. The second auxiliary circuit branch is connected to the second circuit node and is for receiving the second output voltage and in accordance therewith receiving and conducting a second auxiliary branch current from the second circuit node. The bridging resistance is connected between the first and second circuit nodes and is for conducting a bridging current which equals one half of the difference between the first and second auxiliary branch currents, is substantially zero when the first and second input voltages are equal, and is nonzero when the first and second input voltages are unequal. The first output circuit branch is connected to the first input circuit branch and is for receiving the first output voltage and in accordance therewith conducting a first output current which is proportional to the first auxiliary branch current. The second output circuit branch is connected to the second input circuit branch and is for receiving the second output voltage and in accordance therewith conducting a second output current which is proportional to the second auxiliary branch current.

These and other features and advantages of the present invention will be understood upon consideration of the following detailed description of the invention and the accompanying drawings.

DETAILED DESCRIPTION OF THE INVENTION

Figure 1:
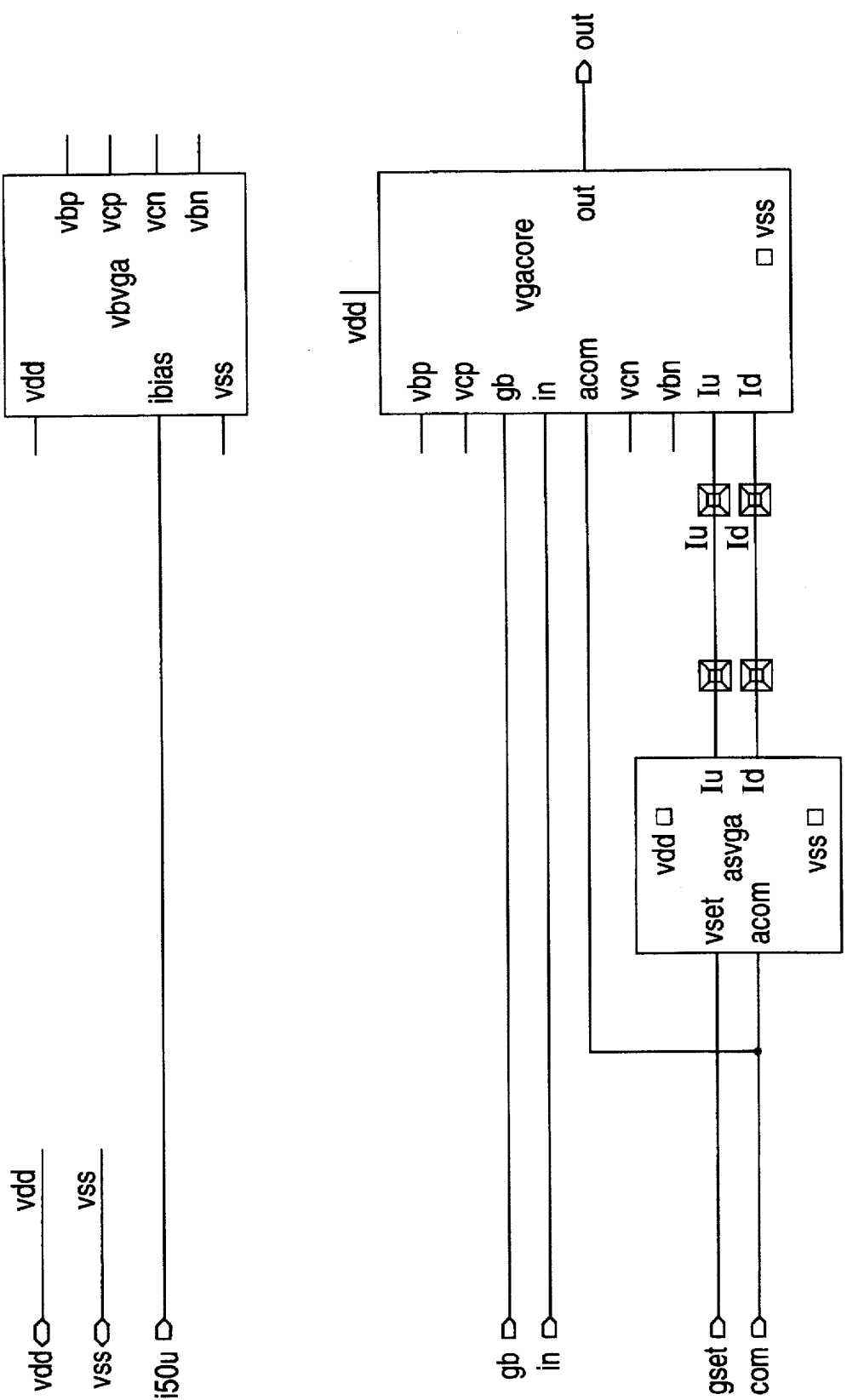
FIG. 1 is a high level functional block diagram of a high speed switching gain amplifier in accordance with one embodiment of the present invention.

Referring to FIG. 1, a high speed variable gain amplifier in accordance with the present invention includes a bias generator circuit VBVGA, a gain control circuit GSVGA and a core amplifier circuit VGACORE. The bias generator circuit VBVGA uses replica bias techniques to establish and provide bias voltages VBP, VCP, VCN, VBN to the amplifier circuit VGACORE. The gain control circuit GSVGA provides two control currents Iu, Id as a multiplying signal to a modified Gilbert cell within the amplifier circuit VGACORE (discussed in more detail below) to control the gain of the amplifier circuit VGACORE. The amplifier circuit VGACORE amplifies the input signal IN by the gain control signal Iu, Id and provides clamping and gain switching functions.

Figure 2:
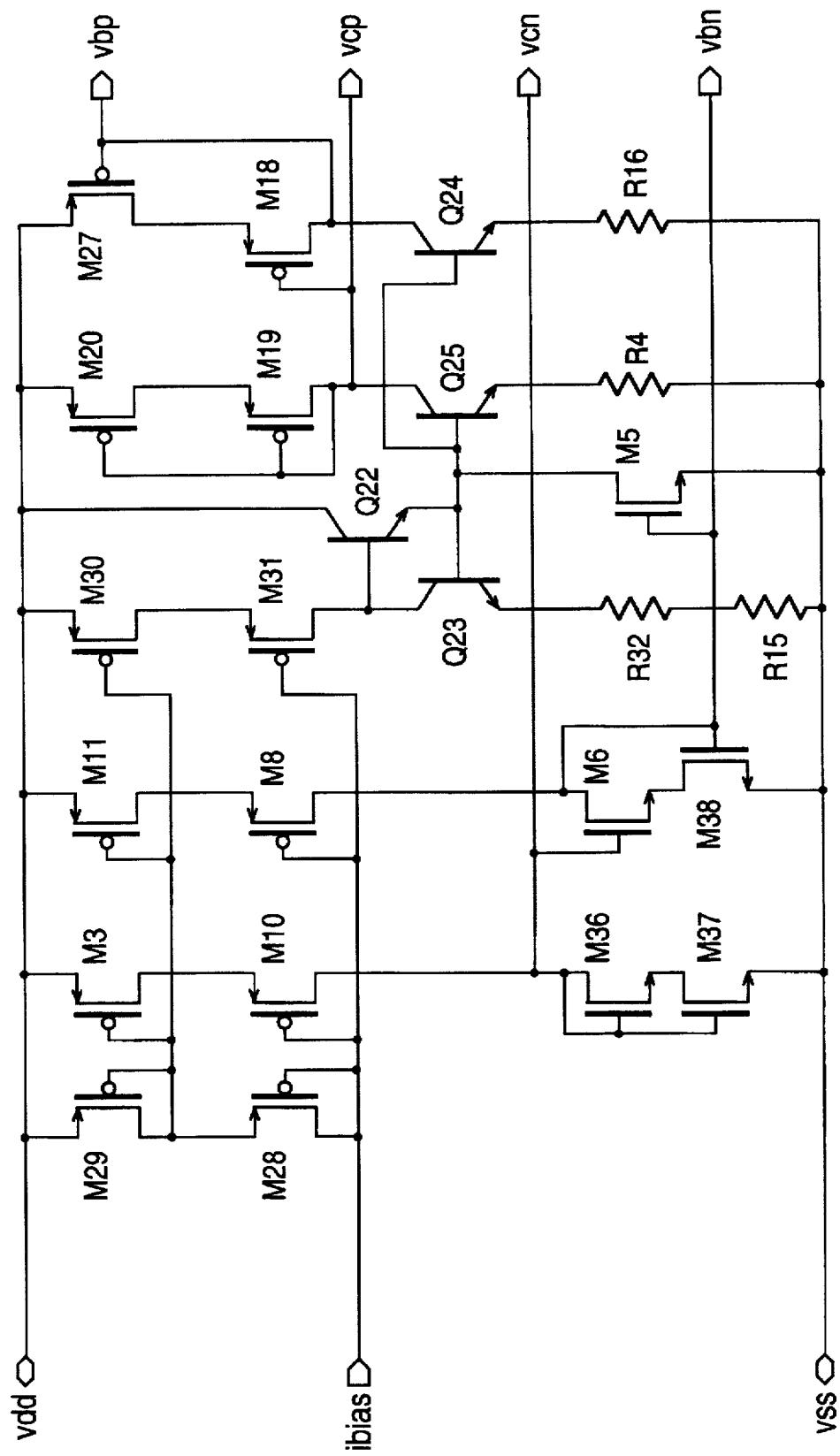
FIG. 2 is a schematic diagram of the bias generator circuit of FIG. 1.

Referring to FIG. 2, the bias generator circuit VBVGA uses replica bias techniques to create a minimum bias cascode current source structure, thereby maximizing the dynamic signal range. Whereas a number of techniques exist for producing a cascode current source, the preferred method is as shown in FIG. 2.

Figure 3:
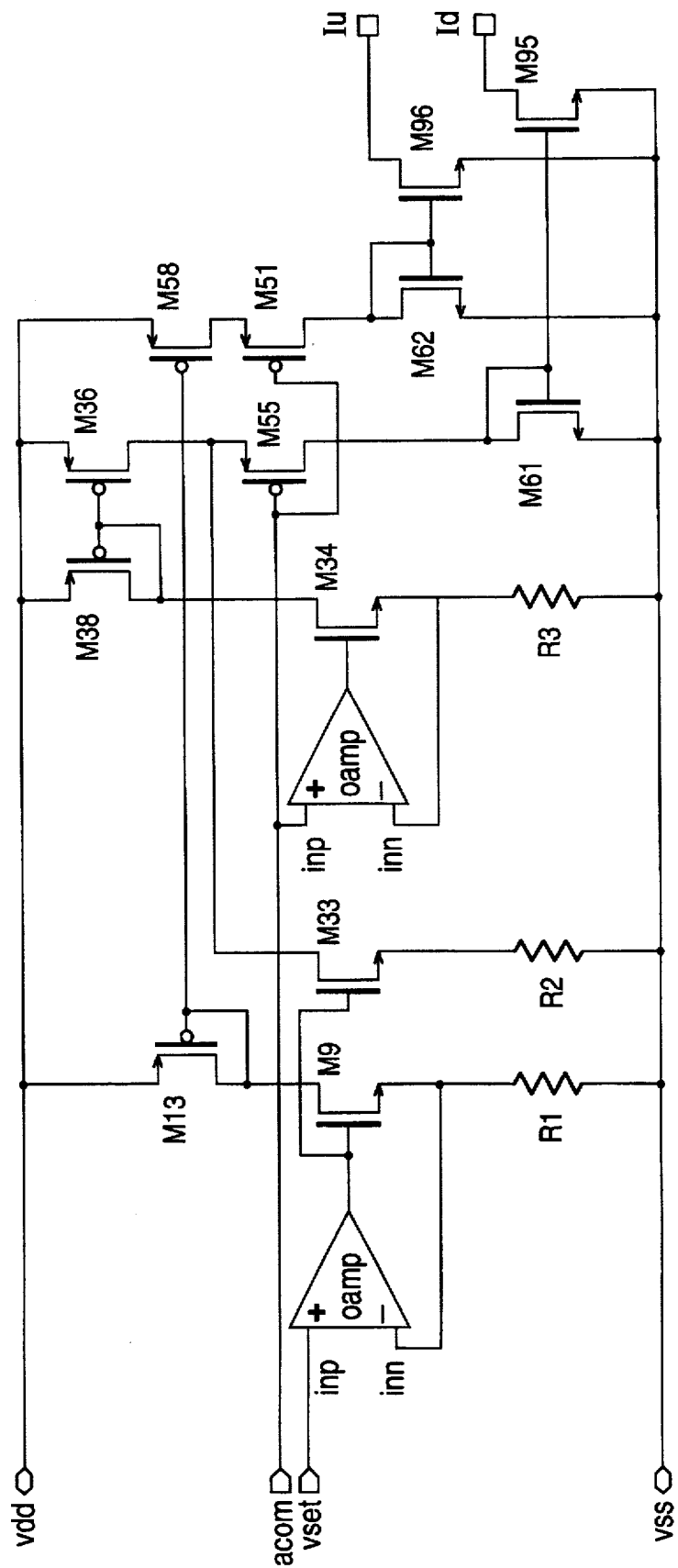
FIG. 3 is a schematic diagram of the gain control circuit of FIG. 1.

Referring to FIG. 3, the gain control circuit includes two voltage-to-current (V-I) converters and a current summing circuit. The input voltages VSET, ACOM to the V-I converters can be derived from a resistor divider (not shown) biased with a reference voltage. It can be shown that the output currents Id and Iu are established in accordance with the input voltages as follows:

$$Id=ACOM/R-Vset/R=(ACOM-Vset)/R \quad (1)$$

$$Iu=Vset/R \quad (2)$$

Figure 4:
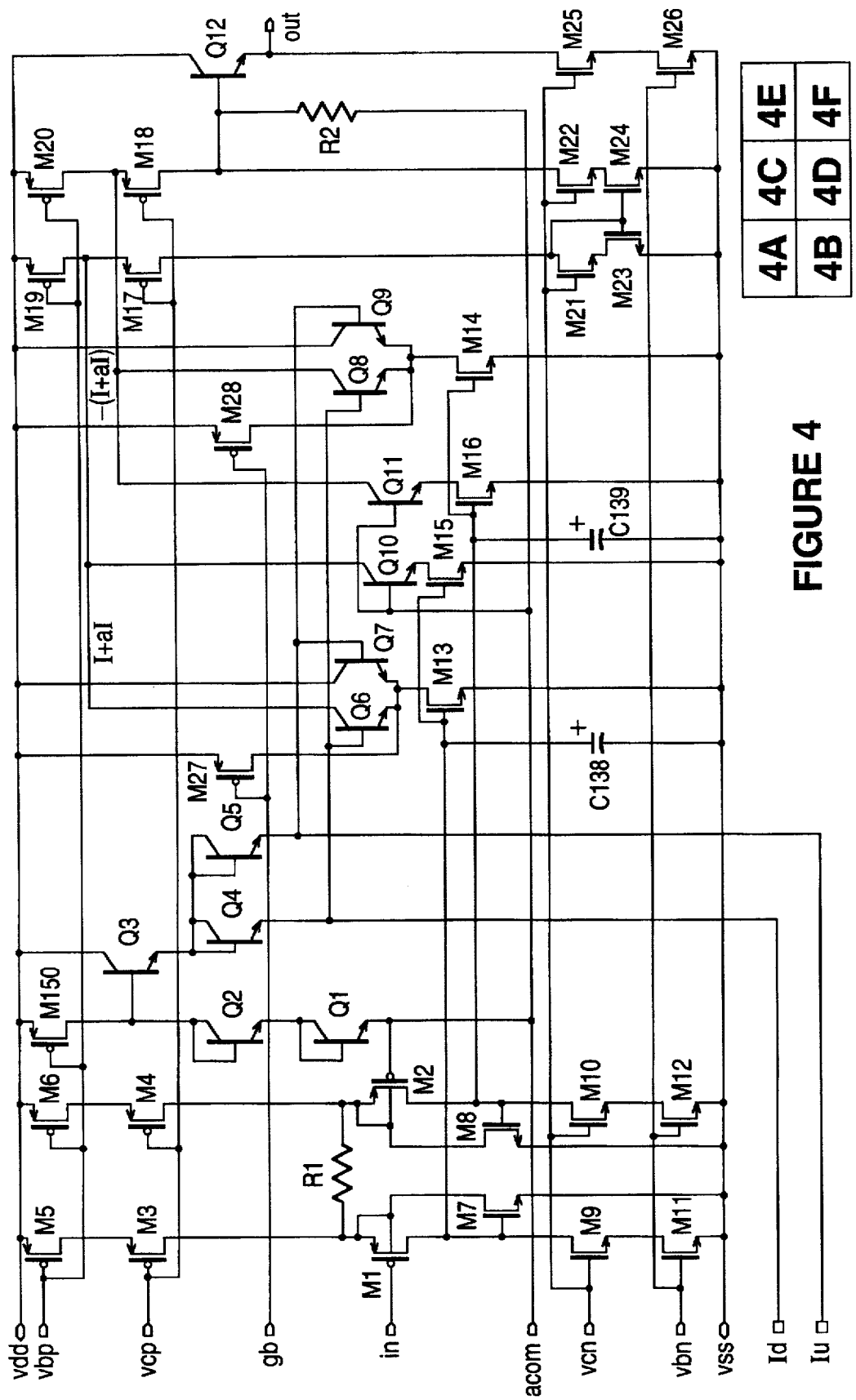
FIG. 4 is a schematic diagram of the core amplifier circuit of FIG. 1.
Figure 4A:
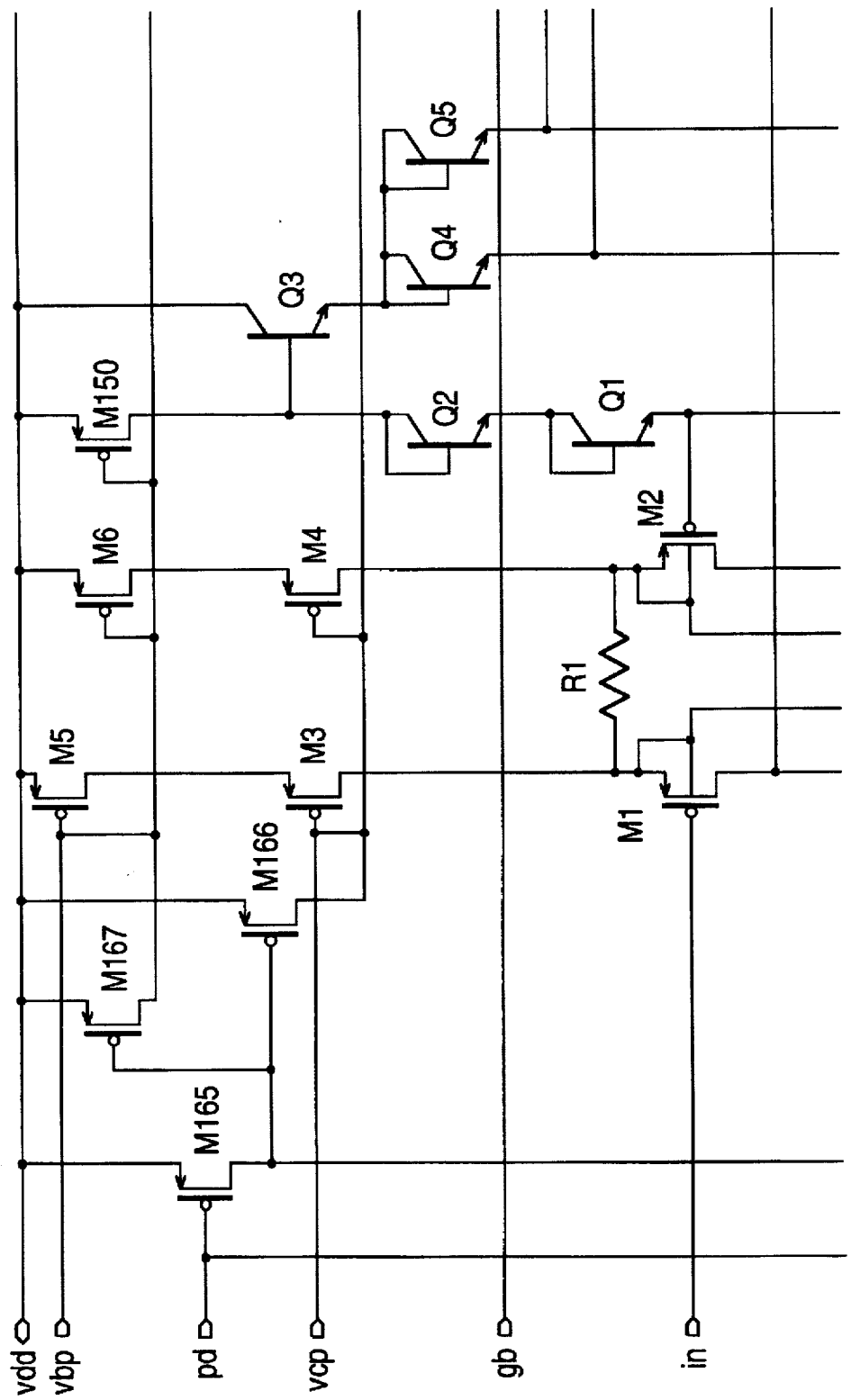
FIGS. 4A, 4B, 4C, 4D, 4E and 4F together form a more detailed schematic diagram of the core amplifier circuit of FIG. 4.
Figure 4B:
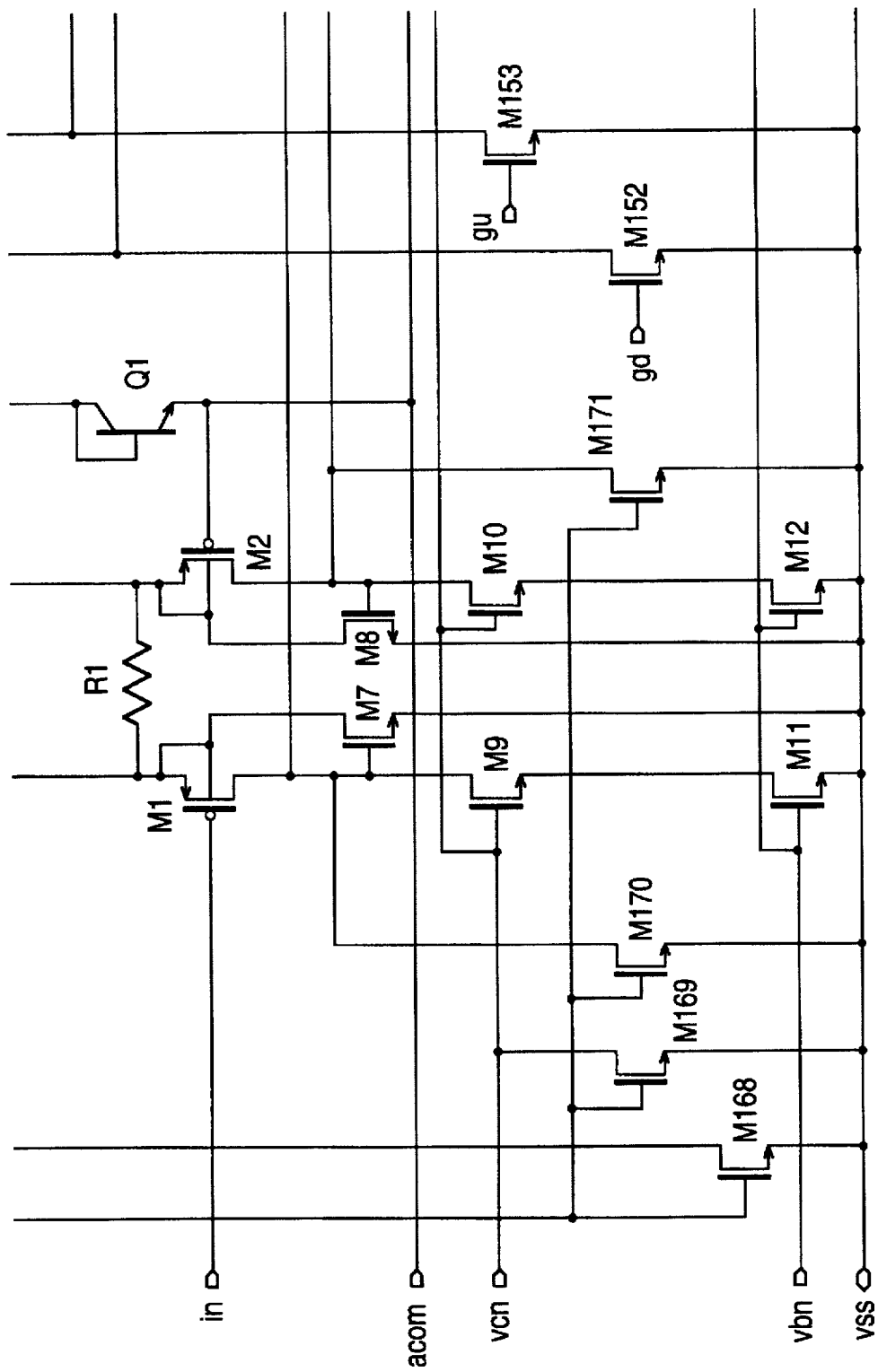
Figure 4C:
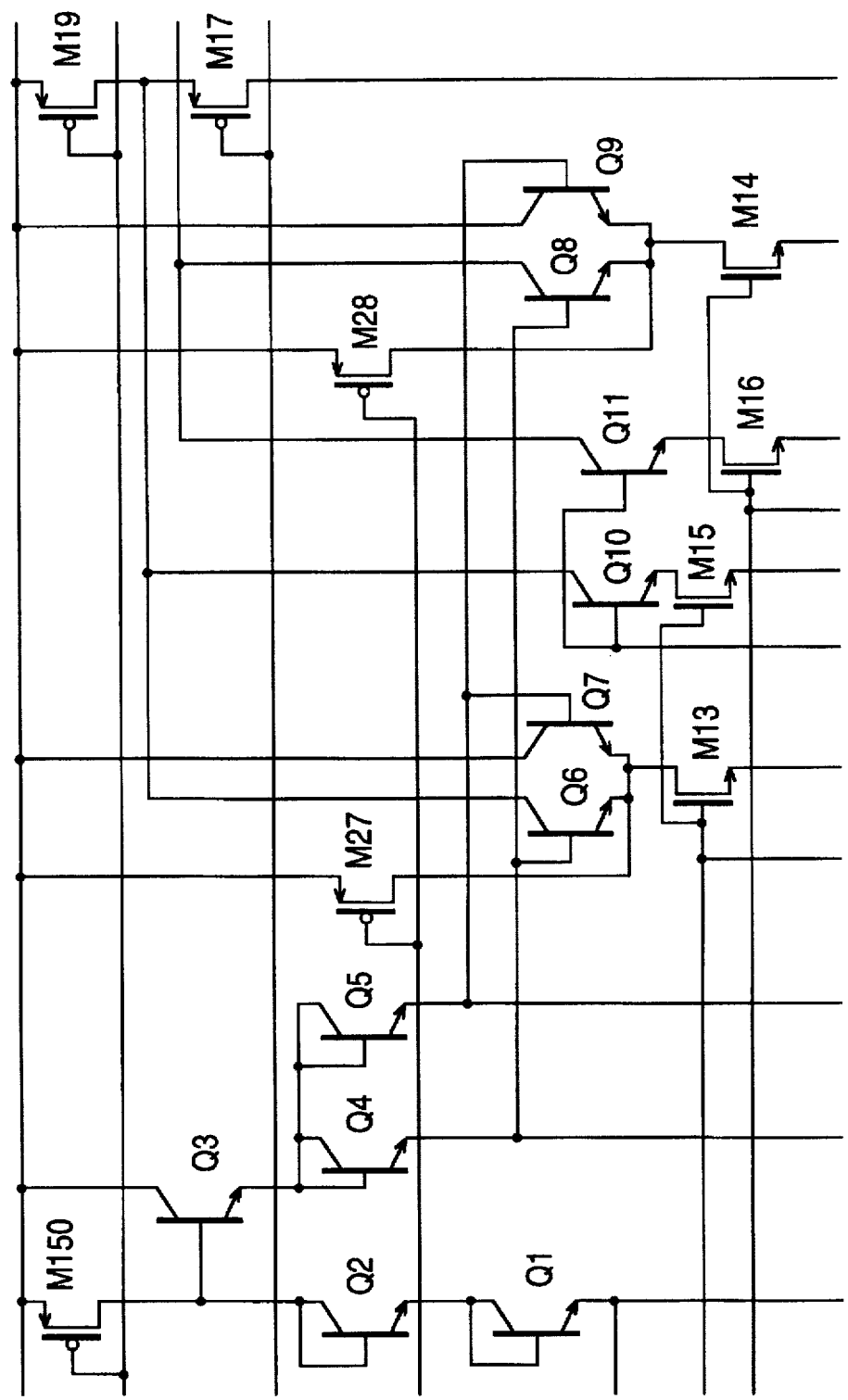
Figure 4D:
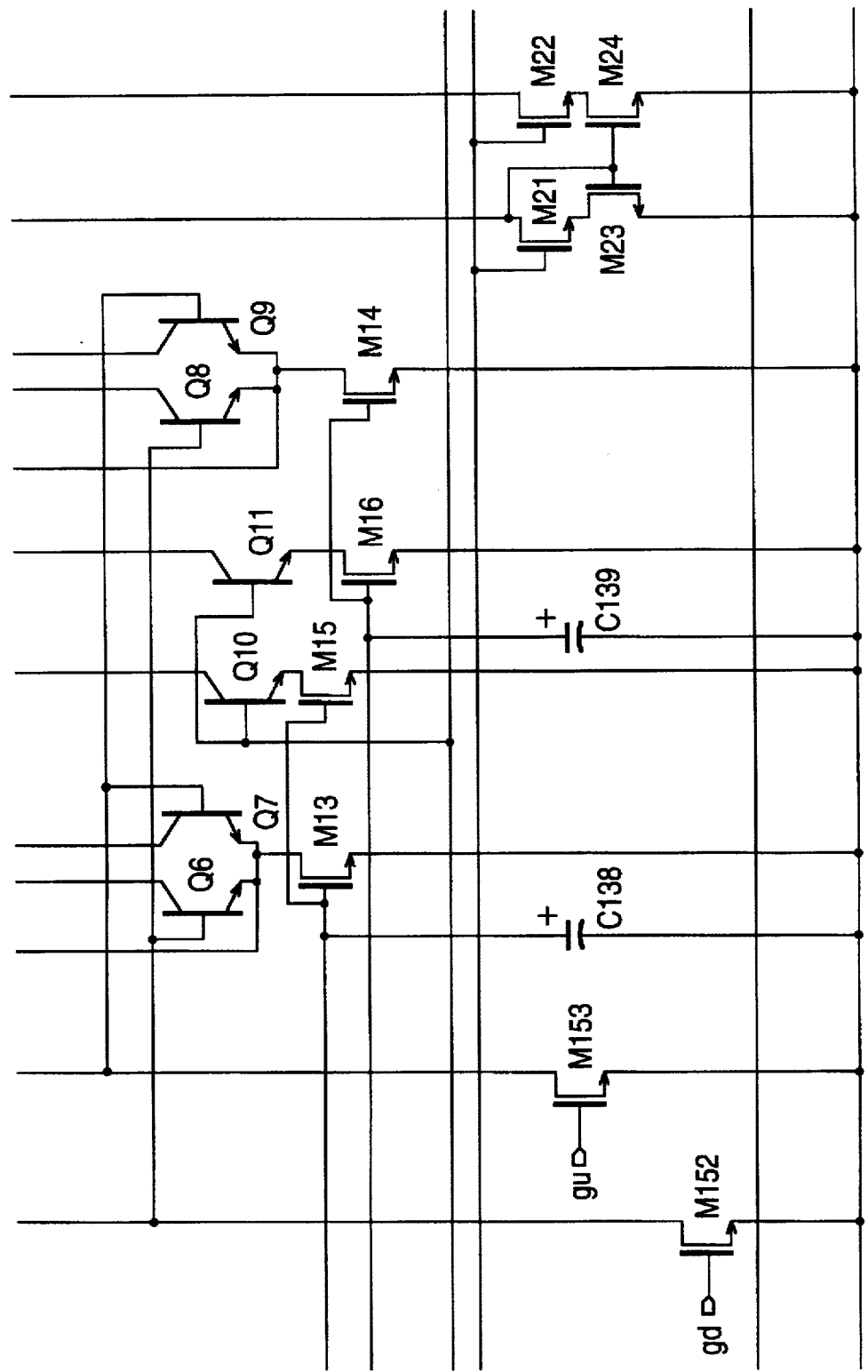
Figure 4E:
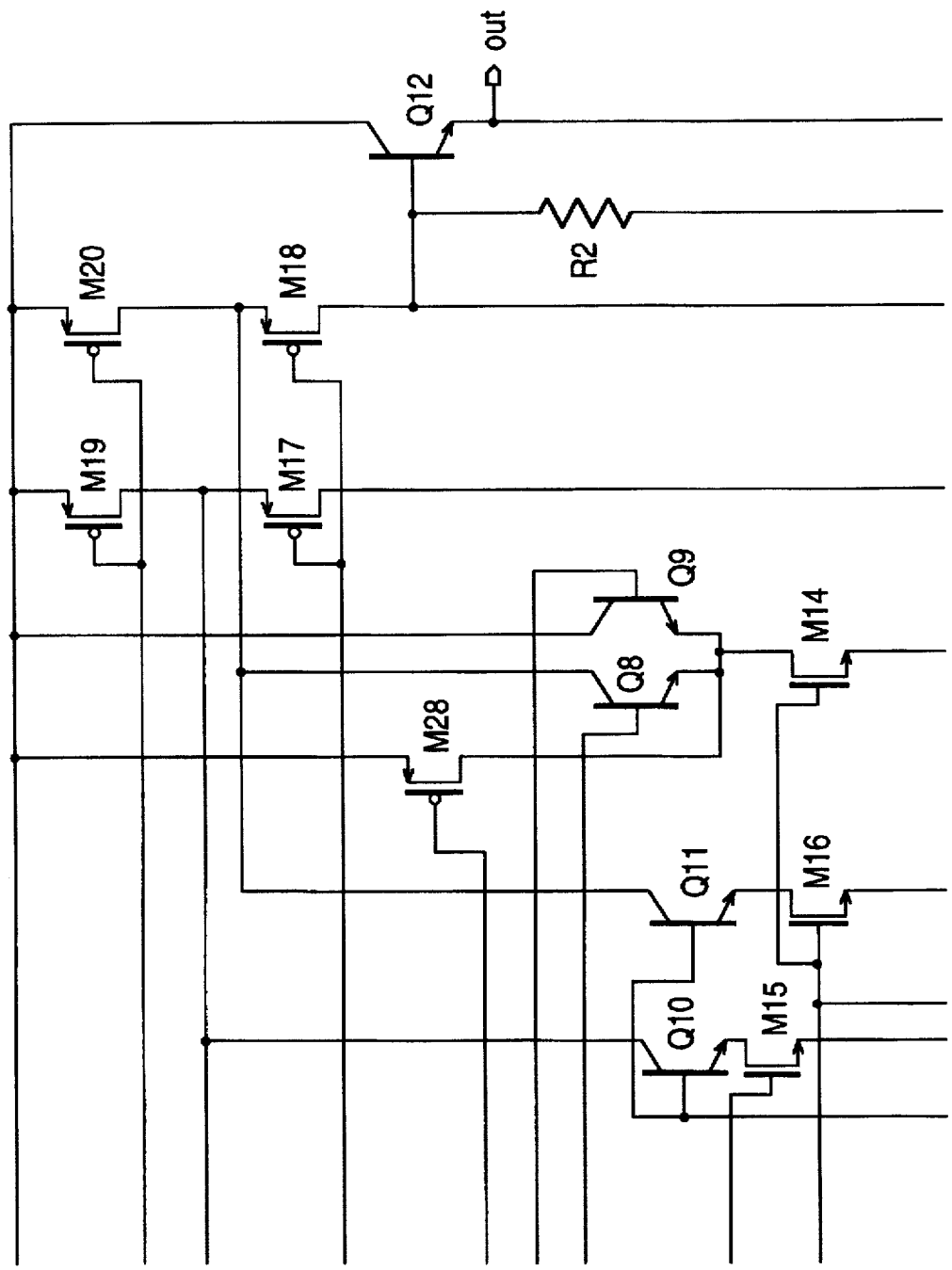
Figure 4F:
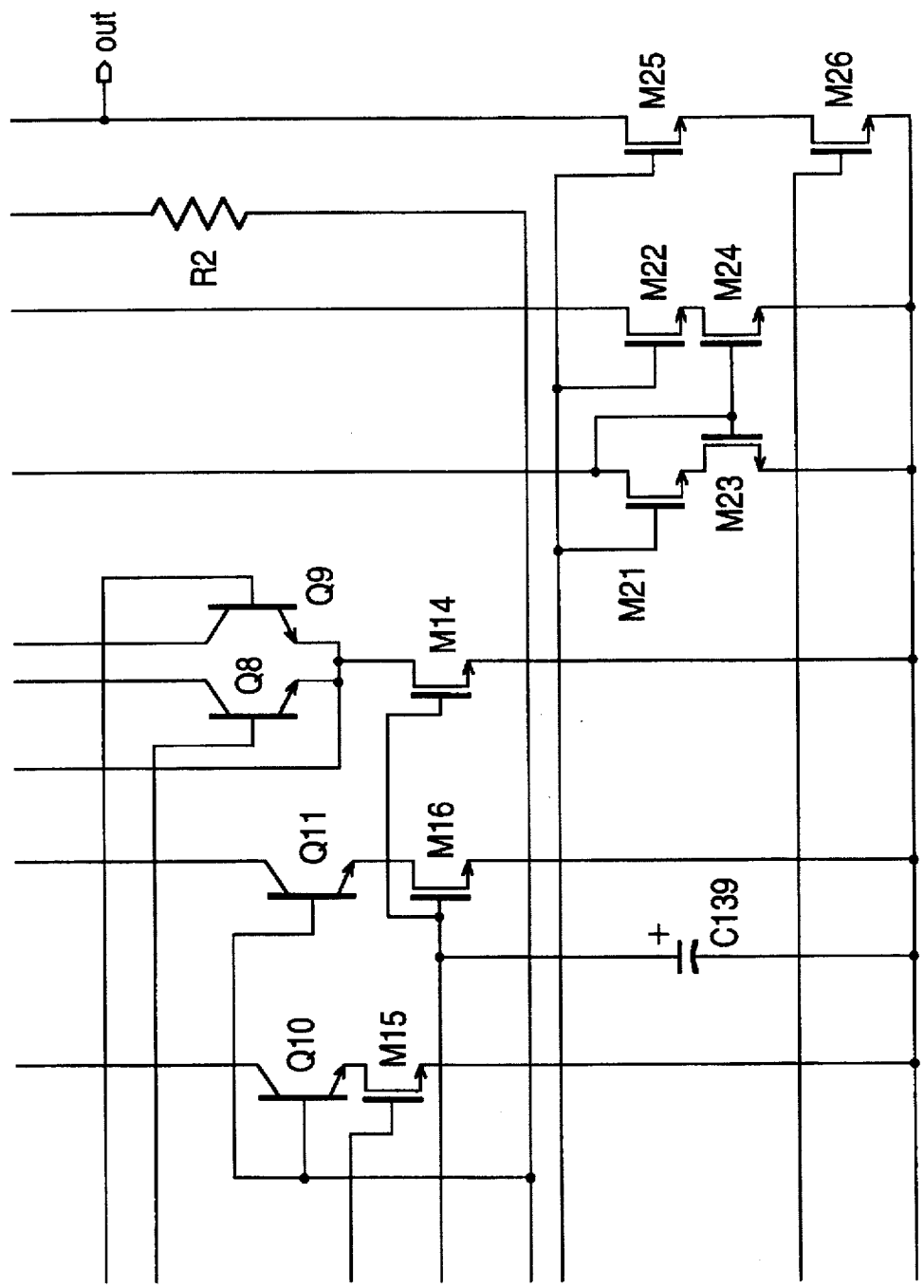

Referring to FIG. 4, the core amplifier also includes a V-I converter, composed primarily of MOSFETs M1–M14, followed by an enhanced and folded Gilbert multiplier, composed primarily of BJTs Q6–Q9. The output current difference of the Gilbert multiplier is further folded in a double-to-single-ended cascode current stage, composed primarily of MOSFETs M17–M24. The output current of the cascode current stage flows into a resistor R2 and gets converted into an output voltage, i.e. the voltage across this resistor R2 is buffered by an emitter follower buffer (Q12, M25, M26) to provide the output OUT.

The V-I converter includes transconductance-boosted P-MOSFET input transistors M1 and M2, P-MOSFET current source transistors M3–M6, resistor R1, N-MOSFET transconductance-booster transistors M7 and M8, and N-MOSFET current mirror transistors M9–M14. The transconductances (GM) of the input transistors P-MOSFET M1 and P-MOSFET M2 are boosted by the feedback loops made up of transistors M1, M9, M11 and M7 on the input side and transistors M2, M10, M12 and M8 on the reference ACOM side of the differential input pair. The boost in GM for the P-MOSFET input devices M1, M2 enables a more accurate conversion of the input voltage IN-ACOM to an output current. The differential input voltage, i.e. the voltage difference between the input voltages Vin and ACOM, causes a current to be conducted through resistor R1. This difference current is mirrored by the boost transistors M7, M8 and current mirror transistors M13, M14 to the common emitter nodes of the Gilbert multiplier transistors Q6–Q9.

Transistors Q1–Q5 provide a bias voltage to the base of the folded Gilbert multiplier transistors Q6–Q9. This bias voltage is approximately equal to the input reference voltage ACOM, and ensures that all of the NPN transistors Q6–Q11 that form a current amplifier stage have approximately the same bias conditions. The output of the current amplifier stage is formed by the sum of two currents, one current directly from the output of the V-I converter and the other from a multiple of the V-I converter output current from the Gilbert multiplier cell. By way of a gain enable signal GB, transistors M27 and M28 enable a high speed gain boost by adding such multiple current to the output. From the input signal IN side, the collector currents of BJTs Q6 and Q10 sum to form one Gilbert multiplier output current (I+aI), while from the reference ACOM side, the collector currents of BJTs Q8 and Q11 sum to form the other Gilbert multiplier output current –(I+aI). Transistors Q6 and Q7 form a Gilbert multiplier and produce a multiple of the drain current of transistor M13 on the input signal IN side, while transistors Q8 and Q9 form another Gilbert multiplier and produce a multiple of the drain current of transistor M14 on the input ACOM side. The multiplier action is achieved by converting the control current difference Iu–Id to a difference in the base-emitter voltage (VBE) of biasing transistors Q4 and Q5. This VBE voltage difference is further converted into a current difference by the Gilbert multiplier transistor pairs Q6/Q7 and Q8/Q9. The multiple current outputs (I+aI) and –(I+aI) from the current amplifier stage go to the inputs of the differential-to-single-ended current converter.

It can be shown that the "a" term can be expressed as follows:

$$a=Vset/ACOM \quad (3)$$

The differential-to-single-ended current converter includes transistors M17–M24, with P-MOSFET transistors M17–M20 forming a cascode input current pair and N-MOSFET transistors M21–M24 forming a cascoded double-to-single current mirror. The output current of the differential-to-single-ended current converter flows through resistor R2 to produce an unbuffered output voltage. An emitter follower buffer formed by transistor Q12 and current source M25–M26 performs unity gain buffering so that the output node has a low impedance for driving various loads.

A large input, or overdrive, signal in either direction will not deplete the current in the P-MOSFET M3–M6 and N-MOSFET M9–M12 current sources in the V-I converter or in the cascode current sources M17–M20 in the differential-to-single-ended current converter. Since none of the current sources mm off, no transistor goes out of its normal operating bias condition; therefore, recovery from an overdriven input signal is fast. The current in R2 is limited by the difference in input voltage across R1.

Figure 5:
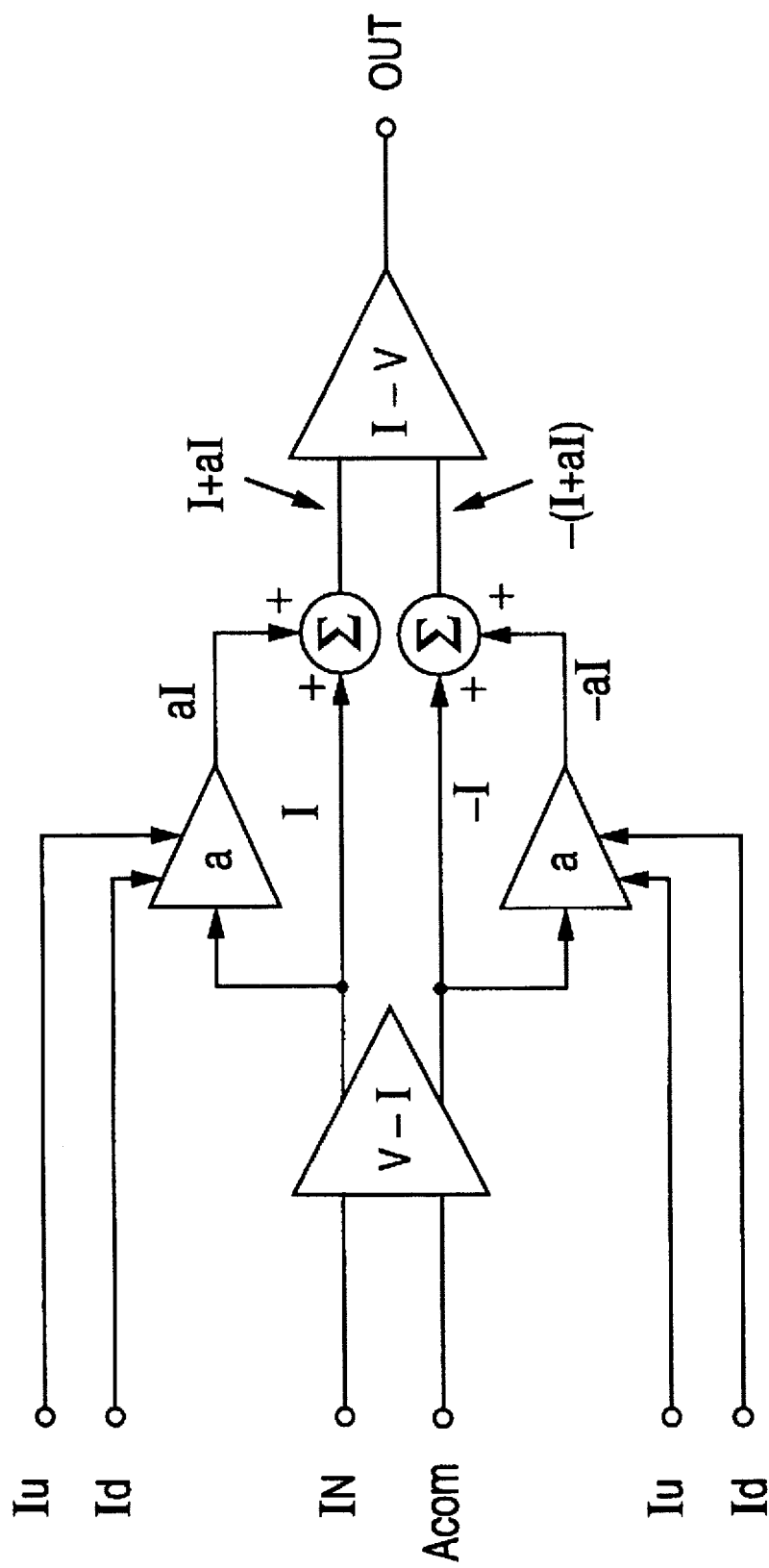
FIG. 5 is a functional block diagram representing the controllable current gain feature of the core amplifier circuit of FIG. 1.

Referring to FIG. 5, the controllable current gain feature of the core amplifier circuit of FIG. 1 can be represented as shown, i.e. as a serial arrangement of a voltage-to-current (V-I) converter and current-to-voltage (I-V) converter with a current gain control stage interposed between them. The differential input voltage IN-ACOM is converted by transistors M1–M16 to a set of differential currents which are selectively, in accordance with gain control signals Iu and Id, multiplied by transistors Q6–Q11. Of the resulting, selectively multiplied, differential current (I+aI)/-(I+aI), current phase (I+aI) is formed by summing its current components I and aI at the node connecting the drain and source terminals of transistors M19 and M17, respectively, while current phase –(I+aI) is formed by summing its current components –I and –aI at the node connecting the drain and source terminals of transistors M20 and M18, respectively. This differential current is then converted by transistors M17–M24 and resistor R2 to a single-ended voltage which is buffered by transistors Q12, M25 and M26 to provide the final output voltage OUT.

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a metal oxide semiconductor field effect transistor (MOSFET) amplifier with a boosted transconductance comprising:

a first transistor having first gate, drain and source terminals for receiving a first input voltage via said first gate terminal, conducting a first drain-to-source current via said first drain and source terminals, and having a first gate-to-source voltage across said first gate and source terminals;

a second transistor having second gate, drain and source terminals for conducting a second drain-to-source current via said second drain and source terminals, wherein said second gate terminal is connected to said first drain terminal and said second drain terminal is connected to said first source terminal;

a first current source, connected between said second gate and source terminals, for providing a first fixed current as said first drain-to-source current;

a third transistor having third gate, drain and source terminals for receiving a second input voltage via said third gate terminal, conducting a third drain-to-source current via said third drain and source terminals, having a third gate-to-source voltage across said third gate and source terminals, and having a third drain-to-source voltage across said third drain and source terminals;

a fourth transistor having fourth gate, drain and source terminals for conducting a fourth drain-to-source current via said fourth drain and source terminals, wherein said fourth gate terminal is connected to said third drain terminal and said fourth drain terminal is connected to said third source terminal; and a second current source, connected between said fourth gate and source terminals, for providing a second fixed current as said third drain-to-source current;

wherein said first gate-to-source voltage remains fixed in accordance with said fixed first drain-to-source current and said second drain-to-source current is generated in accordance with said first input voltage; and wherein said third gate-to-source voltage remains fixed in accordance with said fixed third drain-to-source current and said fourth drain-to-source current is generated in accordance with said second input voltage.

2. The apparatus of claim 1, wherein said first and second current sources comprise fifth and sixth transistors for biasing with first and second fixed voltages and in accordance therewith providing said first and second fixed currents, respectively.

3. The apparatus of claim 1, further comprising a third current source connected to said first source terminal and said second drain terminal for providing a first supply current which is equal to a sum of said first and second drain-to-source currents, and still further comprising a fourth current source connected to said third source terminal and said fourth drain terminal for providing a second supply current which is equal to a sum of said third and fourth drain-to-source currents.

4. The apparatus of claim 3, wherein said third and fourth current sources comprise fifth and sixth transistors for biasing with first and second fixed voltages and in accordance therewith providing said first and second supply currents, respectively.

5. The apparatus of claim 1, wherein said amplifier operates in a differential manner and further comprises a resistance connected between said first and third source terminals.

6. An apparatus including a metal oxide semiconductor field effect transistor (MOSFET) amplifier with a differential current mirror circuit comprising:

first and second circuit nodes;

a first input circuit branch, connected to said first circuit node, for receiving and conducting a first input branch current from said first circuit node and receiving a first input voltage and in accordance therewith providing a first output voltage;

a first auxiliary circuit branch, connected to said first circuit node, for receiving said first output voltage and in accordance therewith receiving and conducting a first auxiliary branch current from said first circuit node;

a second input circuit branch, connected to said second circuit node, for receiving and conducting a second input branch current from said second circuit node and receiving a second input voltage and in accordance therewith providing a second output voltage;

a second auxiliary circuit branch, connected to said second circuit node, for receiving said second output voltage and in accordance therewith receiving and conducting a second auxiliary branch current from said second circuit node;

a bridging resistance, connected between said first and second circuit nodes, for conducting a bridging current which equals one half of a difference between said first and second auxiliary branch currents, is substantially zero when said first and second input voltages are equal, and is nonzero when said first and second input voltages are unequal;

a first output circuit branch, connected to said first input circuit branch, for receiving said first output voltage and in accordance therewith conducting a first output current which is proportional to said first auxiliary branch current; and a second output circuit branch, connected to said second input circuit branch, for receiving said second output voltage and in accordance therewith conducting a second output current which is proportional to said second auxiliary branch current.

7. The apparatus of claim 6, wherein said first input circuit branch comprises a first current source and a first transistor with first source and drain terminals connected in series for conducting a first fixed branch current as said first input branch current.

8. The apparatus of claim 7, wherein said second input circuit branch comprises a second current source and a second transistor with second source and drain terminals connected in series for conducting a second fixed branch current as said second input branch current.

9. The apparatus of claim 6, wherein said first auxiliary circuit branch comprises a transistor which includes:

a gate terminal connected to said first input circuit branch for receiving said first output voltage; and a drain terminal connected to said first circuit node for receiving and conducting said first auxiliary branch current as a drain current.

10. The apparatus of claim 6, wherein said first output circuit branch comprises a transistor which includes:
   a gate terminal connected to said first input circuit branch for receiving said first output voltage; and
   drain and source terminals for conducting said first output current.

11. The apparatus of claim 6, further comprising first and second current sources connected to said first and second circuit nodes for providing first and second supply currents thereto, respectively, wherein a sum of said first and second supply currents equals a sum of said first and second input branch currents and said first and second auxiliary branch currents, and wherein when said first and second input voltages are equal said first supply current equals a sum of said first input branch current and said first auxiliary branch current and said second supply current equals a sum of said second input branch current and said second auxiliary branch current.

12. The apparatus of claim 6, wherein said first and second output circuit branches comprise first and second differential signal multiplier circuits, respectively, for receiving said first and second output currents as a first differential input signal, receiving a second differential input signal and multiplying said first and second differential input signals and in accordance therewith providing a differential output signal representing a product of said first and second differential input signals.

13. The apparatus of claim 12, further comprising a differential-to-single-ended converter circuit, connected to said first and second differential signal multiplier circuits, for receiving and converting said differential output signal to a single-ended output signal.

14. An apparatus including a voltage-to-current-to-voltage converter with a selectively variable current gain, said converter comprising:
   a voltage-to-current converter stage for receiving and converting an input signal voltage to a plurality of input signal currents;
   a current controller stage, coupled to said voltage-to-current converter stage, for receiving at least one gain control signal and said plurality of input signal currents and in accordance therewith providing an output signal current, wherein
      a ratio of said output signal current to said plurality of input signal currents is established in accordance with said at least one gain control signal,
      said current controller stage comprises a differential current controller for receiving a differential input signal current as a portion of said plurality of input signal currents and providing a differential output signal current as said output signal current,
      a ratio of said differential output signal current to said differential input signal current is established in accordance with said at least one gain control signal, and
      said differential current controller comprises a plurality of controllable current gain paths, one for each phase of said differential input signal current, each of which includes
         a variable gain current amplifier for receiving said at least one gain control signal and one of said plurality of input signal currents and in accordance therewith providing a controlled signal current, and
         a current adder for receiving and adding said controlled signal current and another one of said plurality of input signal currents and in accordance therewith providing a portion of said differential output signal current; and
   a current-to-voltage converter stage, coupled to said current controller stage, for receiving and converting said output signal current to an output signal voltage.

15. An apparatus including a voltage-to-current-to-voltage converter with a selectively variable current gain, said converter comprising:
   a voltage-to-current converter stage for receiving and converting an input signal voltage to a plurality of input signal currents;
   a current controller stage, coupled to said voltage-to-current converter stage, for receiving at least one gain control signal and said plurality of input signal currents and in accordance therewith providing an output signal current, wherein
      a ratio of said output signal current to said plurality of input signal currents is established in accordance with said at least one gain control signal,
      said current controller stage comprises a differential current controller for receiving a differential input signal current as a portion of said plurality of input signal currents and providing a differential output signal current as said output signal current,
      a ratio of said differential output signal current to said differential input signal current is established in accordance with said at least one gain control signal, and
      said differential current controller comprises a plurality of current multiplier circuits, one for each phase of said differential input signal current, each of which includes
         a current buffer for buffering one of said plurality of input signal currents to provide a buffered input signal current,
         a gain controlled current amplifier for receiving said at least one gain control signal and another one of said plurality of input signal currents and in accordance therewith multiplying said another one of said plurality of input signal currents to provide a multiplied input signal current, and
         a current summer, coupled to said current buffer and said gain controlled current amplifier, for receiving and summing said buffered input signal current with said multiplied input signal current; and
   a current-to-voltage converter stage, coupled to said current controller stage, for receiving and converting said output signal current to an output signal voltage.

16. An apparatus including a voltage-to-current-to-voltage converter with a selectively variable current gain, said converter comprising:
   a voltage-to-current converter stage for receiving and converting an input signal voltage to a plurality of input signal currents;
   a current controller stage, coupled to said voltage-to-current converter stage, for receiving at least one gain control signal and said plurality of input signal currents and in accordance therewith providing an output signal current, wherein
      a ratio of said output signal current to said plurality of input signal currents is established in accordance with said at least one gain control signal,
      said current controller stage comprises a plurality of current multiplier circuits, each of which includes
         a current buffer for buffering one of said plurality of input signal currents to provide a buffered input signal current, a gain controlled current amplifier for receiving said at least one gain control signal and another one of said plurality of input signal currents and in accordance therewith multiplying said another one of said plurality of input signal currents to provide a multiplied input signal current, and a current summer, coupled to said current buffer and said gain controlled current amplifier, for receiving and summing said buffered input signal current with said multiplied input signal current; and a current-to-voltage converter stage, coupled to said current controller stage, for receiving and converting said output signal current to an output signal voltage.

17. An apparatus including a voltage-to-current-to-voltage converter with a selectively variable current gain, said converter comprising:

a voltage-to-current converter stage for receiving and converting an input signal voltage to a plurality of input signal currents;

a current controller stage, coupled to said voltage-to-current converter stage, for receiving at least one gain control signal and said plurality of input signal currents and in accordance therewith providing an output signal current, wherein a ratio of said output signal current to said plurality of input signal currents is established in accordance with said at least one gain control signal; and a current-to-voltage converter stage, coupled to said current controller stage, for receiving and converting said output signal current to an output signal voltage, wherein said current-to-voltage converter stage comprises a partially differential current-to-voltage converter for receiving and converting a differential output signal current as said output signal current to a single-ended output signal voltage as said output signal voltage.

18. An apparatus including a voltage-to-current-to-voltage converter with a selectively variable current gain, said converter comprising:

a voltage-to-current converter stage for receiving and converting an input signal voltage to a plurality of input signal currents;

a current controller stage, coupled to said voltage-to-current converter stage, for receiving at least one gain control signal and said plurality of input signal currents and in accordance therewith providing an output signal current, wherein a ratio of said output signal current to said plurality of input signal currents is established in accordance with said at least one gain control signal; and a current-to-voltage converter stage, coupled to said current controller stage, for receiving and converting said output signal current to an output signal voltage, wherein said current-to-voltage converter stage operates in a gain compression mode without saturating or mining off when said input signal voltage exceeds a predetermined value.

19. A method of providing an apparatus including a metal oxide semiconductor field effect transistor (MOSFET) amplifier with a boosted transconductance, said method comprising the steps of:

providing a first transistor having first gate, drain and source terminals for performing the step of receiving a first input voltage via said first gate terminal, conducting a first drain-to-source current via said first drain and source terminals, and having a first gate-to-source voltage across said first gate and source terminals;

providing a second transistor having second gate, drain and source terminals for performing the step of conducting a second drain-to-source current via said second drain and source terminals, wherein said second gate terminal is connected to said first drain terminal and said second drain terminal is connected to said first source terminal;

providing a first current source, connected between said second gate and source terminals, for performing the step of generating a first fixed current as said first drain-to-source current;

providing a third transistor having third gate, drain and source terminals for performing the step of receiving a second input voltage via said third gate terminal, conducting a third drain-to-source current via said third drain and source terminals, having a third gate-to-source voltage across said third gate and source terminals, and having a third drain-to-source voltage across said third drain and source terminals;

providing a fourth transistor having fourth gate, drain and source terminals for performing the step of conducting a fourth drain-to-source current via said fourth drain and source terminals, wherein said fourth gate terminal is connected to said third drain terminal and said fourth drain terminal is connected to said third source terminal; and providing a second current source, connected between said fourth gate and source terminals, for performing the step of generating a second fixed current as said third drain-to-source current;

wherein said first gate-to-source voltage remains fixed in accordance with said fixed first drain-to-source current and said second drain-to-source current is generated in accordance with said first input voltage; and wherein said third gate-to-source voltage remains fixed in accordance with said fixed third drain-to-source current and said fourth drain-to-source current is generated in accordance with said second input voltage.

20. The method of claim 19, wherein said steps of providing first and second current sources comprise providing fifth and sixth transistors for performing the steps of biasing thereof with first and second fixed voltages and in accordance therewith generating said first and second fixed currents, respectively.

21. The method of claim 19, further comprising the step of providing a third current source connected to said first source terminal and said second drain terminal for performing the step of generating a first supply current which is equal to a sum of said first and second drain-to-source currents, and still further comprising the step of providing a fourth current source connected to said third source terminal and said fourth drain terminal for performing the step of generating a second supply current which is equal to a sum of said third and fourth drain-to-source currents.

22. The method of claim 21, wherein said steps of providing third and fourth current sources comprise providing fifth and sixth transistors for performing the steps of biasing thereof with first and second fixed voltages and in accordance therewith generating said first and second supply currents, respectively.

23. The method of claim 19, wherein said method of providing an apparatus including a MOSFET amplifier with a boosted transconductance comprises providing a MOSFET amplifier with a boosted transconductance which operates in a differential manner and further comprises the step of providing a resistance connected between said first and third source terminals.

24. A method of providing an apparatus including a voltage-to-current-to-voltage converter with a selectively variable current gain, said method comprising the steps of:

provided a voltage-to-current converter stage for performing the step of receiving and converting an input signal voltage to a plurality of input signal currents;

providing a current controller stage, coupled to said voltage-to-current converter stage, for performing the step of receiving at least one gain control signal and said plurality of input signal currents and in accordance therewith generating an output signal current, wherein a ratio of said output signal current to said plurality of input signal currents is established in accordance with said at least one gain control signal, said step of providing a current controller stage comprises providing a differential current controller for performing the step of receiving a differential input signal current as a portion of said plurality of input signal currents and generating a differential output signal current as said output signal current, a ratio of said differential output signal current to said differential input signal current is established in accordance with said at least one gain control signal, and said step of providing a differential current controller comprises providing a plurality of controllable current gain paths, one for each phase of said differential input signal current, each of which includes a variable gain current amplifier for performing the step of receiving said at least one gain control signal and one of said plurality of input signal currents and in accordance therewith generating a controlled signal current, and a current adder for performing the step of receiving and adding said controlled signal current and another one of said plurality of input signal currents and in accordance therewith generating a portion of said differential output signal current; and providing a current-to-voltage converter stage, coupled to said current controller stage, for performing the step of receiving and converting said output signal current to an output signal voltage.

25. A method of providing an apparatus including a voltage-to-current-to-voltage converter with a selectively variable current gain, said method comprising the steps of:

providing a voltage-to-current converter stage for performing the step of receiving and converting an input signal voltage to a plurality of input signal currents;

providing a current controller stage, coupled to said voltage-to-current converter stage, for performing the step of receiving at least one gain control signal and said plurality of input signal currents and in accordance therewith generating an output signal current, wherein a ratio of said output signal current to said plurality of input signal currents is established in accordance with said at least one gain control signal, said step of providing a current controller stage comprises providing a differential current controller for performing the step of receiving a differential input signal current as a portion of said plurality of input signal currents and generating a differential output signal current as said output signal current, a ratio of said differential output signal current to said differential input signal current is established in accordance with said at least one gain control signal, and said step of providing a differential current controller comprises providing a plurality of current multiplier circuits, one for each phase of said differential input signal current, each of which includes a current buffer for performing the step of buffering one of said plurality of input signal currents to generate a buffered input signal current, a gain controlled current amplifier for performing the step of receiving said at least one gain control signal and another one of said plurality of input signal currents and in accordance therewith multiplying said another one of said plurality of input signal currents to generate a multiplied input signal current, and a current summer, coupled to said current buffer and said gain controlled current amplifier, for performing the step of receiving and summing said buffered input signal current with said multiplied input signal current; and providing a current-to-voltage converter stage, coupled to said current controller stage, for performing the step of receiving and converting said output signal current to an output signal voltage.

26. A method of providing an apparatus including a voltage-to-current-to-voltage converter with a selectively variable current gain, said method comprising the steps of:

providing a voltage-to-current converter stage for performing the step of receiving and converting an input signal voltage to a plurality of input signal currents;

providing a current controller stage, coupled to said voltage-to-current converter stage, for performing the step of receiving at least one gain control signal and said plurality of input signal currents and in accordance therewith generating an output signal current, wherein a ratio of said output signal current to said plurality of input signal currents is established in accordance with said at least one gain control signal, said step of providing a current controller stage comprises providing a plurality of current multiplier circuits, each of which includes a current buffer for performing the step of buffering one of said plurality of input signal currents to generate a buffered input signal current, a gain controlled current amplifier for performing the step of receiving said at least one gain control signal and another one of said plurality of input signal currents and in accordance therewith multiplying said another one of said plurality of input signal currents to generate a multiplied input signal current, and a current summer, coupled to said current buffer and said gain controlled current amplifier, for performing the step of receiving and summing said buffered input signal current with said multiplied input signal current; and providing a current-to-voltage converter stage, coupled to said current controller stage, for performing the step of receiving and converting said output signal current to an output signal voltage.

27. A method of providing an apparatus including a voltage-to-current-to-voltage converter with a selectively variable current gain, said method comprising the steps of:

providing a voltage-to-current converter stage for performing the step of receiving and converting an input signal voltage to a plurality of input signal currents;

providing a current controller stage, coupled to said voltage-to-current converter stage, for performing the step of receiving at least one gain control signal and said plurality of input signal currents and in accordance therewith generating an output signal current, wherein a ratio of said output signal current to said plurality of input signal currents is established in accordance with said at least one gain control signal; and providing a current-to-voltage converter stage, coupled to said current controller stage, for performing the step of receiving and converting said output signal current to an output signal voltage, wherein said step of providing a current-to-voltage converter stage comprises providing a partially differential current-to-voltage converter for performing the step of receiving and converting a differential output signal current as said output signal current to a single-ended output signal voltage as said output signal voltage.

28. A method of providing an apparatus including a voltage-to-current-to-voltage converter with a selectively variable current gain, said method comprising the steps of:

providing a voltage-to-current converter stage for performing the step of receiving and converting an input signal voltage to a plurality of input signal currents;

providing a current controller stage, coupled to said voltage-to-current converter stage, for performing the step of receiving at least one gain control signal and said plurality of input signal currents and in accordance therewith generating an output signal current, wherein a ratio of said output signal current to said plurality of input signal currents is established in accordance with said at least one gain control signal; and providing a current-to-voltage converter stage, coupled to said current controller stage, for performing the step of receiving and converting said output signal current to an output signal voltage, wherein said step of providing a current-to-voltage converter stage comprises providing a current-to-voltage converter stage which operates in a gain compression mode without saturating or mining off when said input signal voltage exceeds a predetermined value.

29. A method of providing an apparatus including a metal oxide semiconductor field effect transistor (MOSFET) amplifier with a differential current mirror circuit, said method comprising the steps of:

providing first and second circuit nodes;

providing a first input circuit branch, connected to said first circuit node, for performing the step of receiving and conducting a first input branch current from said first circuit node and receiving a first input voltage and in accordance therewith generating a first output voltage;

providing a first auxiliary circuit branch, connected to said first circuit node, for performing the step of receiving said first output voltage and in accordance therewith receiving and conducting a first auxiliary branch current from said first circuit node;

providing a second input circuit branch, connected to said second circuit node, for performing the step of receiving and conducting a second input branch current from said second circuit node and receiving a second input voltage and in accordance therewith generating a second output voltage;

providing a second auxiliary circuit branch, connected to said second circuit node, for performing the step of receiving said second output voltage and in accordance therewith receiving and conducting a second auxiliary branch current from said second circuit node;

providing a bridging resistance, connected between said first and second circuit nodes, for performing the step of conducting a bridging current which equals one half of a difference between said first and second auxiliary branch currents, is substantially zero when said first and second input voltages are equal, and is nonzero when said first and second input voltages are unequal;

providing a first output circuit branch, connected to said first input circuit branch, for performing the step of receiving said first output voltage and in accordance therewith conducting a first output current which is proportional to said first auxiliary branch current; and providing a second output circuit branch, connected to said second input circuit branch, for performing the step of receiving said second output voltage and in accordance therewith conducting a second output current which is proportional to said second auxiliary branch current.

30. The method of claim 29, wherein said step of providing a first input circuit branch comprises providing a first current source and a first transistor with first source and drain terminals connected in series for performing the step of conducting a first fixed branch current as said first input branch current.

31. The method of claim 30, wherein said step of providing a second input circuit branch comprises providing a second current source and a second transistor with second source and drain terminals connected in series for performing the step of conducting a second fixed branch current as said second input branch current.

32. The method of claim 29, wherein said step of providing a first auxiliary circuit branch comprises providing a transistor which includes:

a gate terminal connected to said first input circuit branch for performing the step of receiving said first output voltage; and a drain terminal connected to said first circuit node for performing the step of receiving and conducting said first auxiliary branch current as a drain current.

33. The method of claim 29, wherein said step of providing a first output circuit branch comprises providing a transistor which includes:

a gate terminal connected to said first input circuit branch for performing the step of receiving said first-output voltage; and drain and source terminals for performing the step of conducting said first output current.

34. The method of claim 29, further comprising the step of providing first and second current sources connected to said first and second circuit nodes for performing the step of outputting first and second supply currents thereto, respectively, wherein a sum of said first and second supply currents equals a sum of said first and second input branch currents and said first and second auxiliary branch currents, and wherein when said first and second input voltages are equal said first supply current equals a sum of said first input branch current and said first auxiliary branch current and said second supply current equals a sum of said second input branch current and said second auxiliary branch current.

35. The method of claim 29, wherein said steps of providing first and second output circuit branches comprise providing first and second differential signal multiplier circuits, respectively, for performing the steps of receiving said first and second output currents as a first differential input signal, receiving a second differential input signal and multiplying said first and second differential input signals and in accordance therewith generating a differential output signal representing a product of said first and second differential input signals.

36. The method of claim 35, further comprising the step of providing a differential-to-single-ended converter circuit, connected to said first and second differential signal multiplier circuits, for performing the step of receiving and converting said differential output signal to a single-ended output signal.

* * * * *

UNITED STATES PATENT AND TRADEMARK OFFICE
CERTIFICATE OF CORRECTION

PATENT NO. : 5,717,360
DATED : February 10, 1998
INVENTOR(S) : HA VU ET AL.

It is certified that error appears in the above-identified patent and that said Letters Patent is hereby corrected as shown below:

In Col. 7, line 3, delete "10" and replace with --to--.

In Col. 9, line 56, delete "mining" and replace with --turning--.

In Col. 13, line 39, delete "mining" and replace with --turning--.

Signed and Sealed this

Twenty-first Day of April, 1998

Attest:

BRUCE LEHMAN

Attesting Officer

Commissioner of Patents and Trademarks